(12) United States Patent
Thomas et al.

(10) Patent No.: US 7,107,022 B1
(45) Date of Patent: Sep. 12, 2006

(54) SINGLE RF OSCILLATOR SINGLE-SIDE BAND MODULATION FOR RFID READERS USING TONE INSERTION DURING READER RECEPTION

(75) Inventors: Michael H. Thomas, Seattle, WA (US); Scott Anthony Cooper, Seattle, WA (US); Aanand Esterberg, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 62 days.

(21) Appl. No.: 11/073,340

(22) Filed: Mar. 4, 2005

(51) Int. Cl.
*H04B 1/68* (2006.01)
(52) U.S. Cl. ............... 455/102; 455/203; 455/109; 455/47; 375/344
(58) Field of Classification Search ............. 455/102, 455/103, 104, 105, 106, 107, 108, 109, 203, 455/47, 71; 375/344, 345, 320
See application file for complete search history.

(56) References Cited

U.S. PATENT DOCUMENTS

| | | | | |
|---|---|---|---|---|
| 4,328,590 A | * | 5/1982 | Lee | 455/203 |
| 4,691,375 A | * | 9/1987 | McGeehan et al. | 455/109 |
| 4,955,083 A | * | 9/1990 | Phillips et al. | 455/102 |
| 5,222,250 A | * | 6/1993 | Cleveland et al. | 455/47 |
| 5,249,202 A | * | 9/1993 | Hillum et al. | 375/320 |
| 5,491,727 A | * | 2/1996 | Petit | 375/344 |
| 7,027,792 B1 | * | 4/2006 | Luff et al. | 455/203 |
| 2005/0099270 A1 | | 5/2005 | Diorio et al. | 340/10.51 |

* cited by examiner

*Primary Examiner*—Lana Le
(74) *Attorney, Agent, or Firm*—Merchant & Gould PC (57) ABSTRACT

A transmitter upconverts a SSB data signal during a first operational mode using a RF upconverting signal having a frequency that is offset from a center frequency of a channel ($\omega_C$) by an amount that depends on the data signal's SSB bandwidth ($\omega_M$). In a second operational mode, the transmitter upconverts a tone signal having a frequency $\omega_M$ using the same RF upconverting signal. The upconverted tone signal can be used as a continuous wave (CW) carrier signal having a frequency $\omega_C$. The transmitter has a single RF oscillator to output both a SSB signal centered at frequency $\omega_C$ during the first mode and a carrier signal of frequency $\omega_C$ during the second mode.

30 Claims, 8 Drawing Sheets

SINGLE RF OSCILLATOR SINGLE-SIDE BAND MODULATION FOR RFID READERS USING TONE INSERTION DURING READER RECEPTION

The present invention is related to the field of Radio Frequency IDentification (RFID) systems, and more specifically to Single-Sideband (SSB) modulation in RFID readers.

BACKGROUND

Radio Frequency IDentification (RFID) systems typically include tags and RFID readers, which are also known as RFID reader/writers. RFID systems can be used in many ways for locating and identifying objects to which they are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using a device called an RFID reader to interrogate one or more RFID tags. Interrogation is performed by the reader transmitting a Radio Frequency (RF) wave. A tag that senses the interrogating RF wave responds by transmitting back another RF wave. The tag generates the transmitted back RF wave either originally, or by reflecting back a portion of the interrogating RF wave, a process known as backscatter. Backscatter may take place in a number of ways.

The RF wave returned from a tag may further encode data stored internally in the tag, such as a number. The response, and the data if available, is decoded by the reader, which thereby identifies, counts, or otherwise interacts with the associated item. The data can denote a serial number, a price, a date, a destination, other attribute(s), any combination of attributes, and so on.

An RFID tag typically includes an antenna system, a power management section, a radio section, and frequently a logical section, a memory, or both. In earlier RFID tags, the power management section included a power storage device, such as a battery. RFID tags with a power storage device are known as active tags. Advances in semiconductor technology have miniaturized the electronics so much that an RFID tag can be powered by the RF signal it receives enough to be operated. Such RFID tags do not include a power storage device, and are called passive tags.

In some RFID readers, data transmission is performed using double-sideband (DSB) modulation, with the information of one sideband being redundant. It is believed that, presently, no RFID readers use SSB modulation during transmission. SSB modulation is advantageous in that it requires half the bandwidth of DSB modulation to transmit the same amount of information.

SUMMARY

In accordance with various described aspects of the present invention, a SSB transmitter that uses a single RF local oscillator signal is provided. In one aspect, the SSB transmitter upconverts a SSB data signal during a first operational mode using a RF upconverting signal having a frequency that is offset from a center frequency of a channel ($\omega_C$) by an amount that depends on the data signal's SSB bandwidth ($\omega_M$). In a second operational mode, the SSB transmitter upconverts a tone signal having a frequency $\omega_M$ using the same RF upconverting signal. The upconverted tone signal can be used as a continuous wave (CW) carrier signal having a frequency $\omega_C$. Thus, a SSB transmitter according to this aspect needs only a single RF oscillator to output a SSB signal centered at frequency $\omega_C$ during the first mode and a carrier signal of frequency $\omega_C$ during the second mode.

In another aspect, the SSB transmitter includes a Hilbert transformer used in generating the SSB data signal and the CW carrier signal. The Hilbert transformer may be a digital implementation (e.g., performed by software) or an analog implementation.

In still another aspect, the SSB transmitter is part of a transceiver in which the transmitter uses a portion of the transmitted CW carrier signal to downconvert a received signal having data modulated on the CW carrier signal.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various embodiments of the present invention are directed to a system, method and apparatus to generate and transmit a single-sideband, large carrier (SSB-LC) signal within a channel during transmit phase and then generate and transmit an unmodulated carrier signal in the center of the same channel during a receive phase. SSB-LC is used because in these embodiments the tag derives its energy from the reader transmit signal. A large carrier component is present during both the reader transmit phase (when modulated data is present) and the receive phase (when only the carrier is transmitted). Some such embodiments can be advantageously used in RFID systems.

Figure 1:
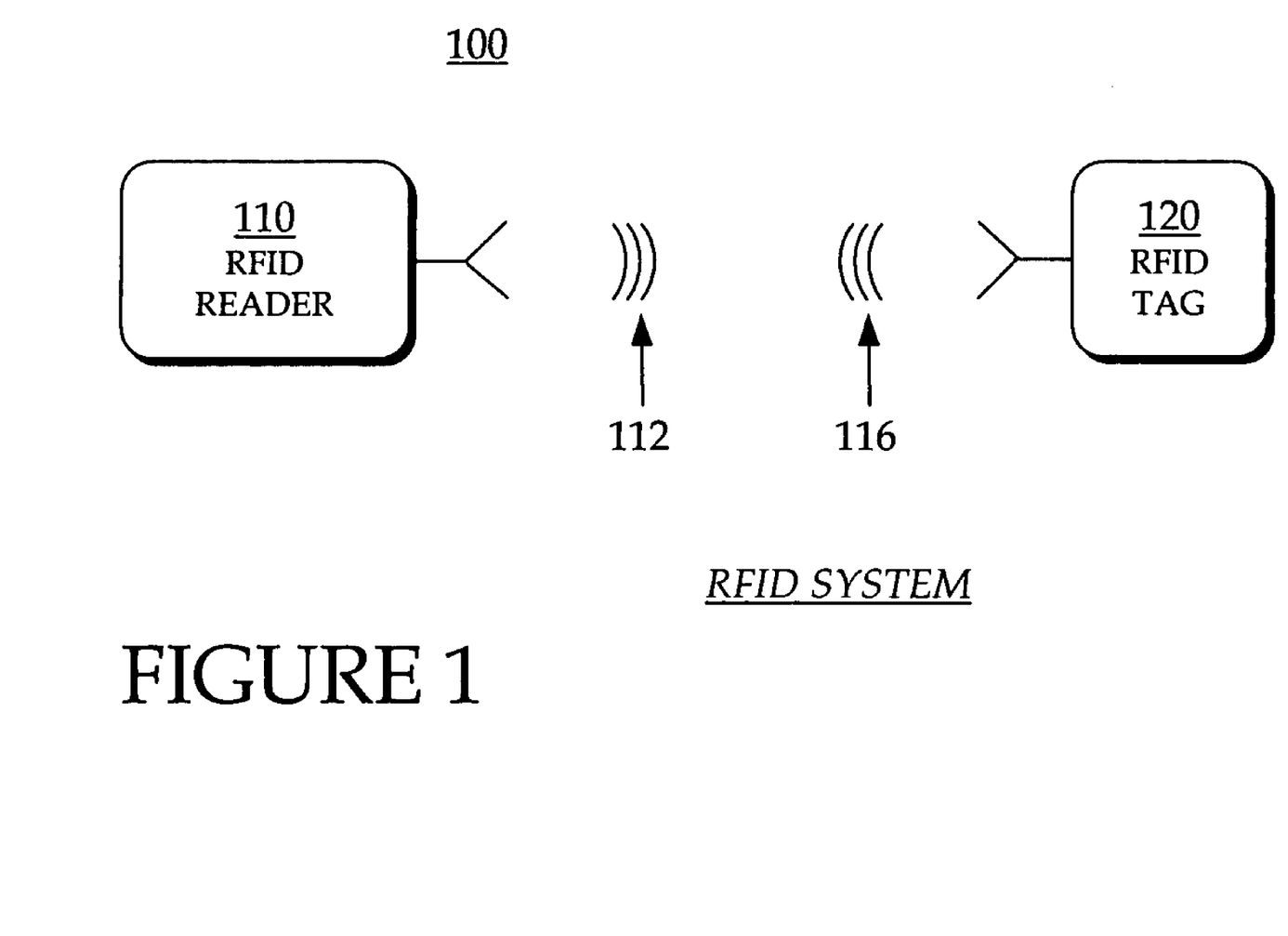
FIG. 1 is a block diagram illustrating an RFID system, according to one embodiment of the present invention.

FIG. 1 is a diagram of an RFID system 100 according to an embodiment of the invention. An RFID reader 110 made according to an embodiment of the invention transmits an interrogating Radio Frequency (RF) signal 112. An RFID tag 120 in the vicinity of RFID reader 110 may sense interrogating RF signal 112, and generate backscatter signal 116 in response. RFID reader 110 senses and interprets backscatter signal 116.

Reader 110 and tag 120 exchange data via signal 112 and signal 116. In a session of such an exchange, each encodes and transmits data to the other, and each receives and decodes data from the other. The data is encoded into, and decoded from, RF waveforms, as will be seen in more detail below. The data itself can be binary, such as "0" and "1". For RFID purposes, it has become common to think of the binary data as RFID symbols.

Figure 2:
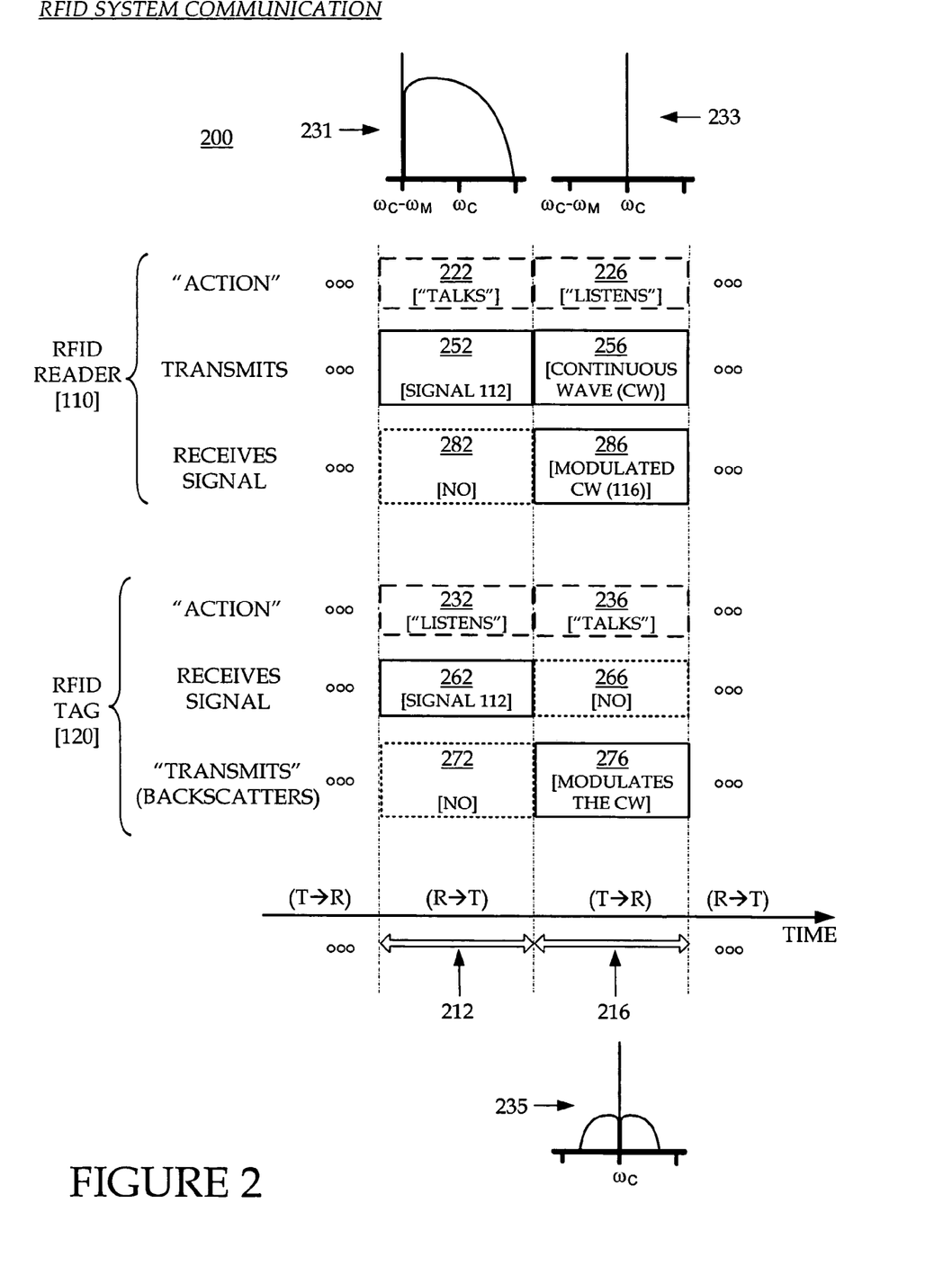
FIG. 2 is a conceptual diagram for explaining the mode of communication between components of the RFID system of FIG. 1.

FIG. 2 is a conceptual diagram 200 for explaining a mode of communication between the components of RFID system 100 of FIG. 1. The explanation is made with reference to a TIME axis, and also to a human metaphor of "talking" and "listening". Exemplary technical implementations for "talking" and "listening" are then described.

RFID reader 110 and RFID tag 120 talk and listen to each other taking turns. As seen on axis TIME, when reader 110 talks to tag 120 the session is designated as "R→T", and when tag 120 talks to reader 110 the session is designated as "T→R". Along the TIME axis, a sample R→T session occurs during a time interval 212, and a following sample T→R session occurs during a time interval 216. Of course intervals 212, 216 can be of variable durations—here the durations are shown approximately equal for purposes of illustration.

As illustrated by blocks 222 and 226, RFID reader 110 talks during interval 212, and listens during interval 216. As illustrated by blocks 232 and 236, RFID tag 120 listens while reader 110 talks (during interval 212), and talks while reader 110 listens (during interval 216).

The remaining blocks below block 222 describe the tag and reader functions in more detail when the reader is talking. As illustrated by block 252, reader 110 transmits information via a modulated RF carrier signal, corresponding to 112 in FIG. 1. At the same time, as illustrated by block 262, tag 120 receives signal 112 and processes it. Meanwhile, as illustrated by to block 272, tag 120 does not backscatter with its antenna, and as illustrated by block 282, reader 110 has no signal to receive from tag 120.

During interval 216, tag 120 talks to reader 110 as follows. As illustrated by block 256, reader 110 transmits towards the tag a Continuous Wave (CW) RF signal, which includes no information content (modulation). As discussed before, this serves both to be harvested by tag 120 for its own internal power needs, and also to generate a wave that tag 120 can backscatter. Indeed, at the same time, as illustrated by block 266, tag 120 does not receive a signal for processing. Instead, as illustrated by block 276, tag 120 modulates the CW emitted according to block 256, so as to generate backscatter signal 116. Concurrently, according to block 286, reader 110 receives backscatter signal 116 and processes it.

Spectrum 231 of signal 112 during interval 212 is also shown in FIG. 2. As can be seen, in this embodiment, spectrum 231 of signal 112 is a single-sideband (SSB) signal with a carrier signal having a frequency of $\omega_C - \omega_M$. $\omega_C$ is the frequency of the aforementioned CW and $\omega_M$ is ideally equal to half of the modulation bandwidth of the information signal. This approach maximizes bandwidth utilization by centering the SSB signal in the available RF channel. In other embodiments, the carrier signal may be at a frequency of $(\omega_C + \omega_M)$.

During interval 216, reader 110 transmits the CW. As shown in FIG. 2, in this embodiment, spectrum 233 of the CW is essentially a single frequency signal at $\omega_C$. Spectrum 235 of signal 116 during interval 216 is also shown in FIG. 2. In this embodiment, signal 116 has a double sideband (DSB) spectrum centered about the CW.

Further, as will be described below, in accordance with embodiments of the present invention, reader 110 uses a single RF local oscillator (LO), having a frequency of $\omega_C \pm \omega_M$, to generate a RF signal that facilitates RF upconversion of either the complex baseband modulation signal during R→T operation or a tone of frequency $\omega_M$ during T→R operation. The composite RF signal after upconversion, 112, transmitted by reader 110 is centered at $\omega_C$, the center frequency of the RF channel, during both R→T and T→R intervals. In accordance with embodiments of the present invention, during interval 212, the baseband SSB modulator presents a SSB composite information signal with approximate bandwidth of $2\omega_M$ to an RF upconverter with LO frequency of $\omega_C \pm \omega_M$. The resulting RF transmission, 231, is thus centered at $\omega_C$ illustrated in block 252. During interval 216, the modulator of reader 110 receives a tone signal of frequency $\omega_M$ and presents a composite tone signal to the RF upconverter driven by the identical LO. The result is a CW carrier centered at $\omega_C$, 233, illustrated in block 256. Various transceiver implementations that provide functionality are described below.

Figure 3:
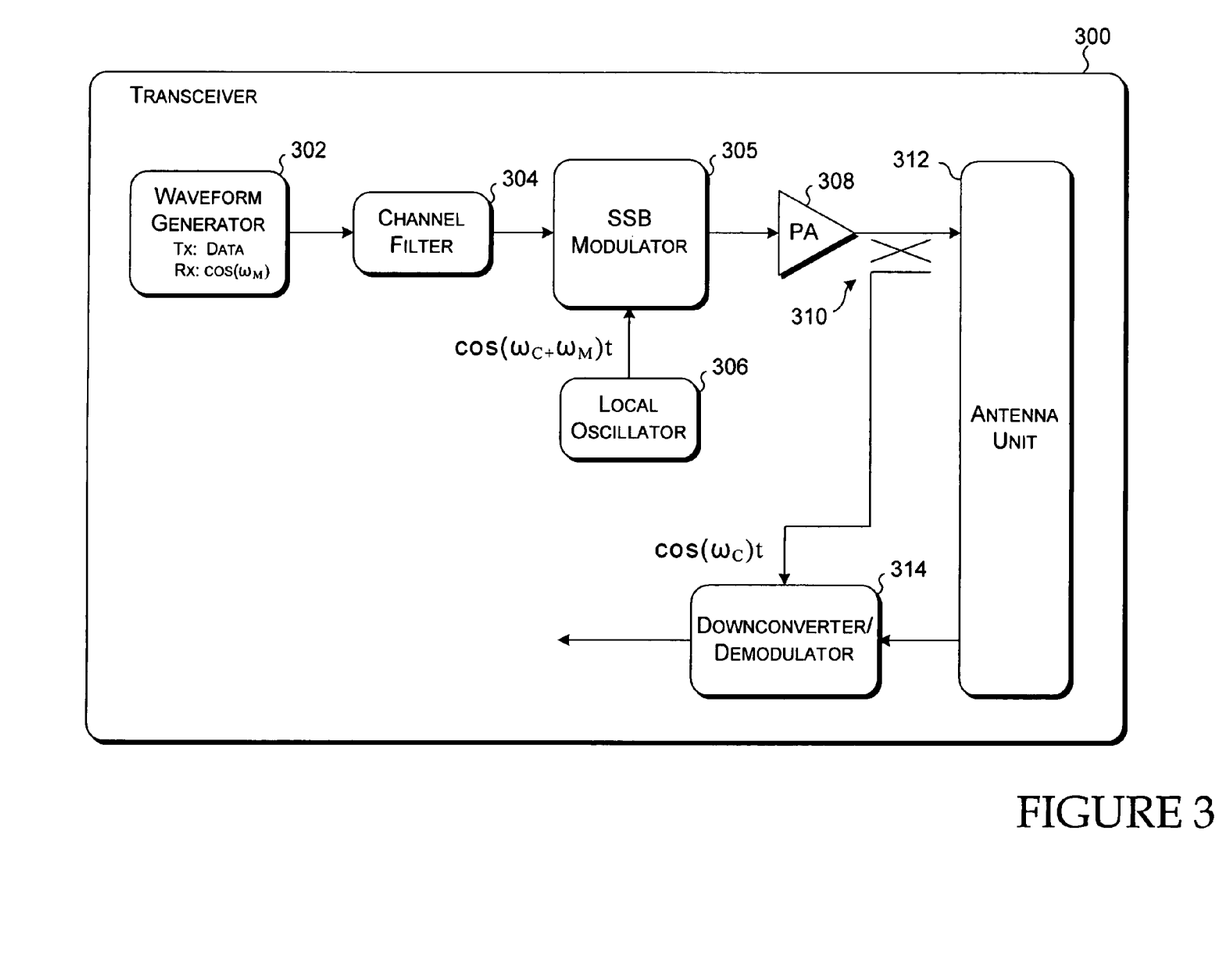
FIG. 3 is a block diagram illustrating a portion of a transceiver included in the reader of FIG. 1, according to one embodiment of the present invention.

FIG. 3 illustrates a portion of a transceiver 300 capable of generating a SSB signal and center channel carrier signal using single LO, according to one embodiment. In this embodiment, transceiver 300 includes a waveform generator 302, a channel filter 304, a SSB modulator/upconverter 305 (also referred to as SSB modulator 305), a LO 306, a power amplifier (PA) 308, a coupler 310, an antenna unit 312 and a downconverter/demodulator 314. Although this embodiment of transceiver 300 implements a direct-conversion receiver, other embodiments may include an intermediate frequency (IF) stage.

In operation during a transmit mode, waveform generator 302 provides a digital signal corresponding to digital data to be transmitted. Channel filter 304 filters the digital data signal so that a sideband of the filtered signal's spectrum will be contained in the intended channel's frequency band. SSB modulator 305 then receives the filtered analog data signal and performs SSB modulation (an embodiment of which is described below in conjunction with FIG. 4) to modulate the data onto a carrier signal having a frequency that is centered in the channel. In this embodiment, an RF signal is generated by LO 306 to have frequency of $\omega_C + \omega_M$, which is then received by SSB modulator 305 to upconvert the SSB data signal. In this way, the SSB data signal can be centered on the carrier frequency and contained in the channel.

PA 308 then receives the output signal from SSB modulator 305 and amplifies it for broadcast via antenna unit 222. In some embodiments, antenna unit 222 includes a duplexer (e.g., directional coupler, circulator, etc.) so that a single antenna can be used for both transmitting and receiving RF signals. In other embodiments, antenna unit 222 may include separate transmit and receive antennas.

In operation during a receive mode, this embodiment of transceiver 300 transmits an unmodulated or continuous wave (CW) carrier signal to provide a carrier signal that a tag (e.g., tag 120 in FIG. 1) may modulate (i.e. backscatter) and from which the tag may scavenge power. In this receive mode, downconverter/demodulator 314 receives a backscatter signal via antenna unit 312. In one embodiment, downconverter/demodulator 314 forms a direct conversion receiver to directly obtain baseband I and Q components signals from the received backscatter signal. To generate the CW carrier signal during the receive mode, waveform generator 302 of transceiver 300 outputs a tone signal having a frequency of $\omega_M$, which is then modulated by SSB modulator 305 using the same $\omega_C+\omega_M$ RF signal generated by LO 306. Thus, only one single frequency RF oscillator is needed to both output the CW carrier signal and to center the spectrum of the SSB data signal on the carrier signal frequency. Otherwise, the transceiver might have to have two LOs: one generating an RF signal having a frequency $\omega_c+\omega_M$ to upconvert the SSB data signal, and another outputting an RF signal having a frequency $\omega_C$ to be transmitted as the CW carrier signal. Thus, the size and cost of transceiver 300 can be reduced.

Figure 4:
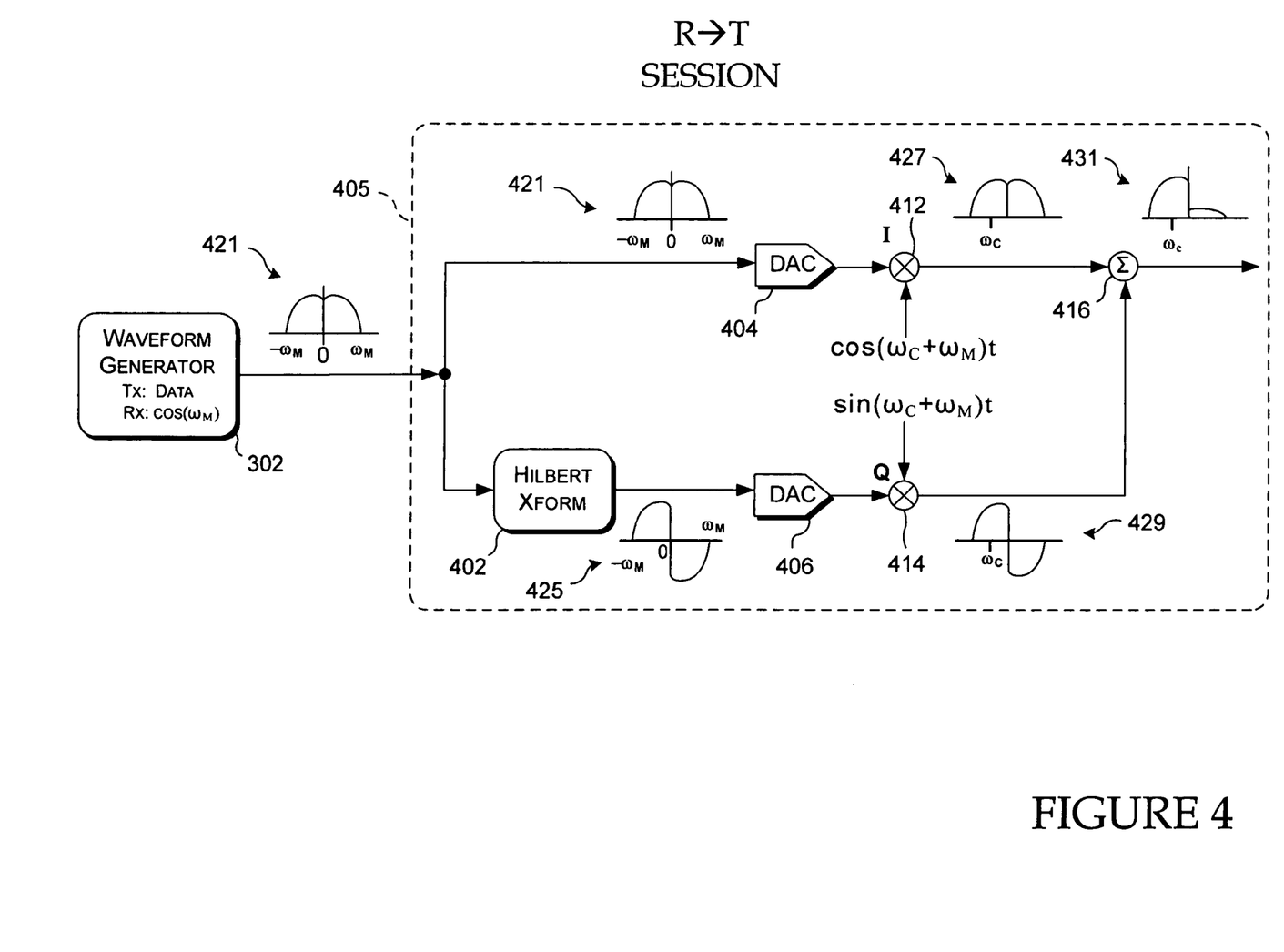
FIG. 4 is block diagram illustrating a digital-based SSB modulator for use in a RFID reader with various signal spectra during reader transmission, according to one embodiment of the present invention.

FIG. 4 illustrates a digital-based SSB modulator 405 (which is implemented in a RFID reader in this example implementation), according to one embodiment of the present invention. Further, FIG. 4 illustrates the spectrum of signals at various points of SSB modulator 405 during R→T operation. In this example implementation, SSB modulator 405 includes a baseband SSB modulator component and a RF upconverter component. More specifically, SSB modulator 405 includes a Hilbert transformer 402, digital-to-analog converters (DACs) 404 and 406, mixers 412 and 414, and a combiner 416 (e.g., a RF summer). Hilbert Transformer 402 and DACs 404 and 406 form the aforementioned baseband SSB modulator component, while combiner 416 and mixers 412 and 414 form the aforementioned RF upconverter component, which is used in conjunction with a LO (not shown) that provides a single frequency RF signal. In this example embodiment, mixers 412 and 414 respectively receive an in-phase (I) RF signal denoted $\cos(\omega_C+\omega_M)t$ and a quadrature (Q) RF signal denoted $\sin(\omega_C+\omega_M)t$.

In R→T operation, SSB modulator 405 receives a complex baseband digital data signal having a spectrum 421. In this example embodiment, this digital data signal is generated by waveform generator 302 and filtered by channel filter 304 (FIG. 2). The digital data signal is then received by Hilbert transformer 402 and DAC 404. Hilbert transformer 402 outputs a digital signal ideally having a spectrum 425 in which one sideband (i.e., the lower sideband in this example) is unchanged relative to spectrum 421, and the other sideband (i.e., the upper sideband in this example) is the inverse of the corresponding sideband of spectrum 421. In accordance with embodiments of the present invention, any suitable digital Hilbert transform implementation may be used to implement Hilbert transformer 402.

DAC 406 receives the digital output signal from Hilbert transformer 402 (i.e., a digital signal having the spectrum 425), and DAC 404 receives the digital data signal from waveform generator 302 and channel filter 304. Spectrum 421 is shown again in FIG. 4 at the input port of DAC 404 to more clearly illustrate the differences between signals received by DACs 404 and 406. These digital signals are then converted to analog signals corresponding to the received digital signals.

The corresponding analog signals outputted by DACs 404 and 406 are respectively received by mixers 412 and 414, which upconvert these received analog signals. In this example embodiment, these analog signals are shifted up in frequency so that their lower sidebands are centered at frequency $\omega_c$. In particular, the upconverted signal outputted by mixer 412 has a spectrum 427, and the upconverted signal outputted by mixer 414 has a spectrum 429.

These upconverted signals are then received by combiner 416 and summed. Because the upper sideband of the signal from mixer 414 is ideally the inverse of the upper sideband of the signal from mixer 412, the upper sidebands cancel each other and the resulting signal is substantially a SSB signal centered on frequency c. The output signal of combiner 416 is illustrated as having a spectrum 431 in which the upper sideband (or image) is not perfectly canceled due to non-ideal performance of one or more components of SSB modulator 405. In many communications applications, presence of a non-zero image can be tolerated.

Although the example embodiment above uses the lower sideband, in other embodiments the upper sideband may be used, for example, by using a RF signal of frequency $\omega_c-\omega_M$ to upconvert the analog output signals of DACs 404 and 406 and designing combiner 416 to output the difference between the upconverted signals from mixers 412 and 414.

Figure 5:
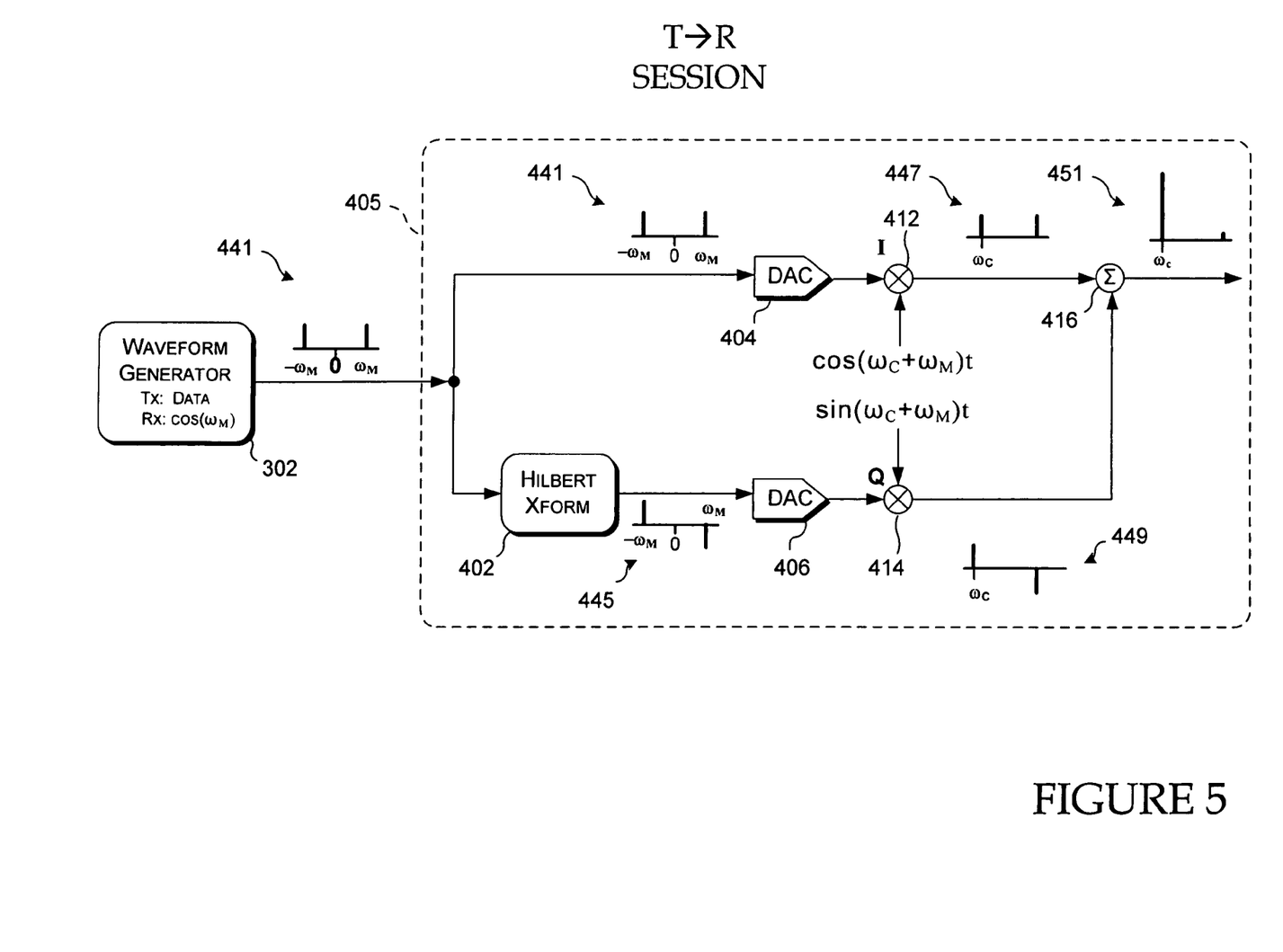
FIG. 5 is block diagram illustrating the digital-based SSB modulator of FIG. 4 with various signal spectra during reader reception, according to one embodiment of the present invention.

FIG. 5 illustrates the digital-based SSB modulator of FIG. 4 with various signal spectra during reader reception, according to one embodiment of the present invention. In T→R operation, SSB modulator 405 receives a tone signal having a frequency of $\omega_M$, as illustrated by spectrum 441. In this example embodiment, waveform generator 302 generates the tone signal. The tone signal is then received by Hilbert transformer 402 and DAC 404. Hilbert transformer 402 outputs a digital tone signal ideally having a spectrum 445 in which one sideband (i.e., the $-\omega_M$ component signal in this example) is unchanged relative to spectrum 441, and the other sideband (i.e., the $+\omega_M$ component signal in this example) is the inverse of the corresponding sideband of spectrum 441.

DAC 406 receives the digital output signal from Hilbert transformer 402 (i.e., a digital signal having spectrum 445), and DAC 404 receives the digital tone signal from waveform generator 302. These digital signals are then converted to analog tone signals corresponding to the received digital signals.

The corresponding analog signals outputted by DACs 404 and 406 are respectively received by mixers 412 and 414, which upconvert these received analog tone signals. As in the above-described R→T operation, these analog tone signals are shifted up in frequency so that their lower sidebands are centered at frequency $\omega_C$. In particular, the upconverted signal outputted by mixer 412 has a spectrum 447, and the upconverted signal outputted by mixer 414 has a spectrum 449.

These upconverted signals are then received by combiner 416 and summed. Because the upper sideband of the upconverted tone signal from mixer 414 is ideally the inverse of the upper sideband of the upconverted Hilbert transformed tone signal from mixer 412, the upper sidebands cancel each other and the resulting signal is substantially a SSB tone signal having a frequency $\omega_C$. The output signal of combiner 416 is illustrated as having a spectrum 451 in which the upper sideband is not perfectly canceled due to non-ideal performance of one or more components of SSB modulator 405.

As previously described, one of the advantages of this embodiment is that a transmitter (or transceiver) needs only one single frequency RF signal to both: (a) transmit a SSB data signal that is centered at a selected frequency; and (b) transmit a CW carrier signal at the selected frequency. Thus, only a single RF oscillator is needed in implementing such a transmitter, which can help reduce size, complexity and cost of the transmitter.

Figure 6:
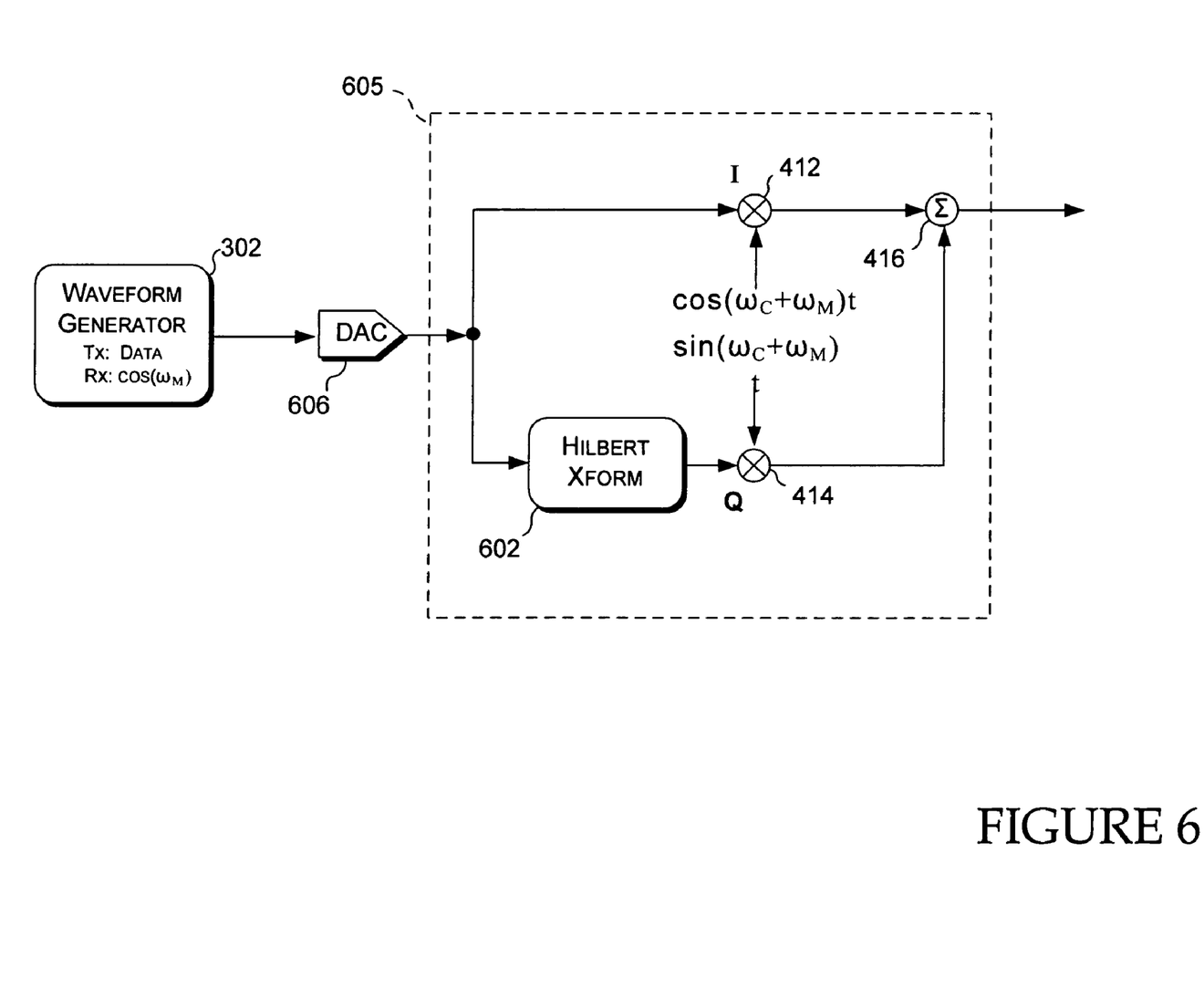
FIG. 6 is block diagram illustrating an analog implementation of a SSB RFID reader, according to one embodiment of the present invention.

FIG. 6 illustrates an analog SSB modulator 605, according to one embodiment of the present invention. In this embodiment, SSB modulator 605 includes an analog Hilbert transformer 602, and mixers 412 and 414. In accordance with embodiments of the present invention, Hilbert transformer 602 can be implemented using any suitable analog Hilbert transformer.

In R→T operation, the digital data signals outputted by waveform generator 302 are converted to analog signals by DAC 606 before being received by SSB modulator 605. Although not shown in FIG. 6, a channel filter is used in this embodiment to ensure that the spectrum of the data signal can be contained the intended channel. In accordance with embodiments of the present invention, the channel filter may be a digital filter between waveform generator 302 and DAC 606, or an analog filter coupled between DAC 606 and SSB modulator 605. The analog data signal is then routed to mixer 412 and to Hilbert transformer 602. Hilbert transformer 602 then inverts the upper sideband of the analog data signal it receives, and outputs the transformed signal to mixer 414. Mixers 412 and 414 then upconvert the analog signals they receive as described above for the embodiment of FIG. 4. Coupler 416 then sums the upconverted analog signals and provides the composite signal to antenna unit 312 (FIG. 4) for broadcast.

In T→R operation, waveform generator 302 outputs a complex digital tone signal having a frequency of $\omega_M$, as in the embodiment of FIG. 5. DAC 606 then converts the tone signal into an analog signal. The analog data signal is then routed to mixer 412 and to Hilbert transformer 602. Hilbert transformer 602 outputs an analog tone signal ideally having one sideband (e.g., the $-\omega_M$ component signal) unchanged relative to spectrum 441, and the other sideband (i.e., the $+\omega_M$ component signal in this example) being inverted. Mixers 412 and 414 then upconvert the analog signals they receive as described above for the embodiment of FIG. 5. These upconverted signals are then received by combiner 416 and summed. Because the upper sideband of the upconverted tone signal from mixer 414 is ideally the inverse of the upper sideband of the upconverted Hilbert transformed tone signal from mixer 412, the upper sidebands cancel each other and the resulting signal is substantially a SSB tone signal having a frequency $\omega_C$.

Figure 7:
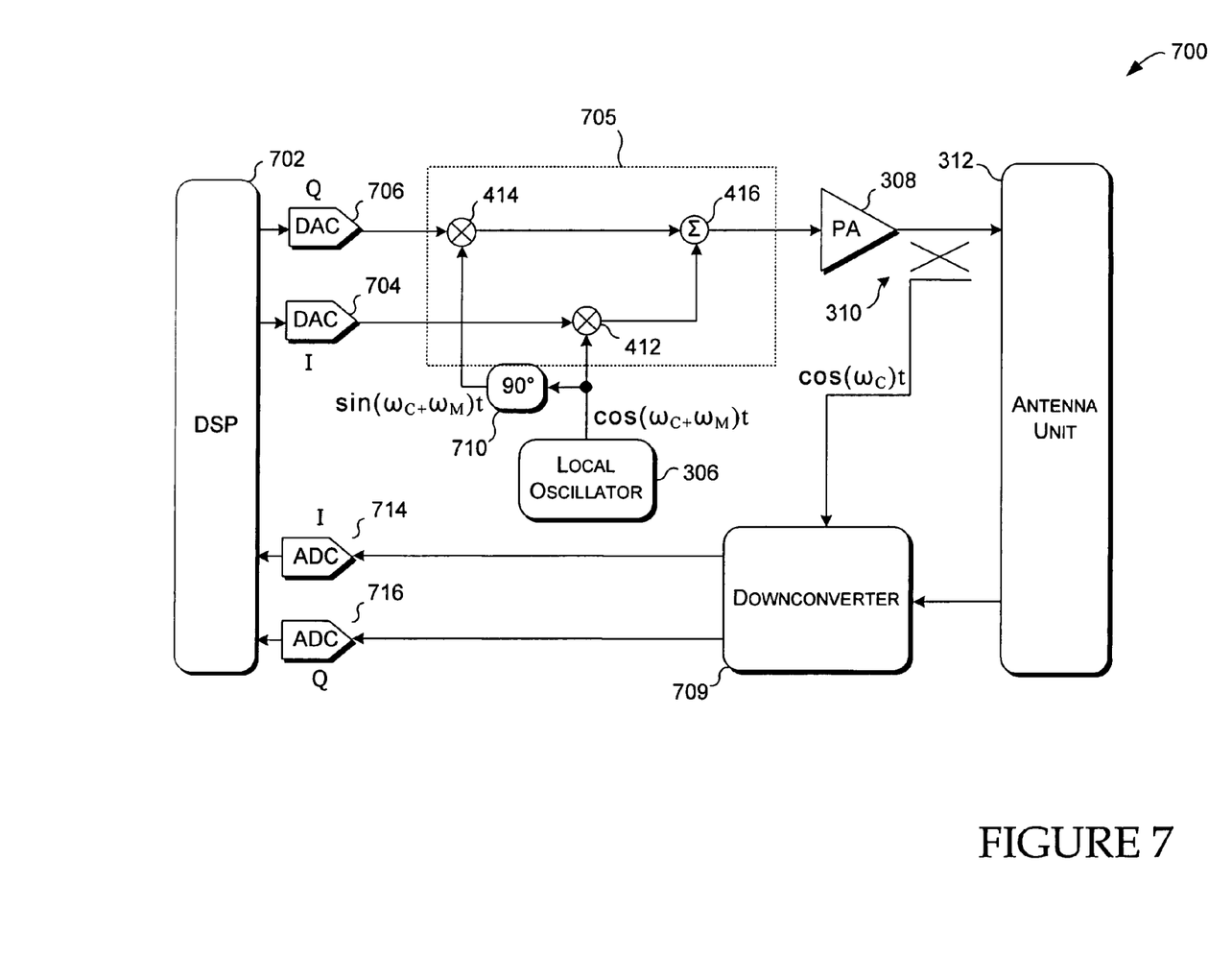
FIG. 7 is a block diagram illustrating a reader having a single, fixed-frequency LO for both the transmit upconversion and receive downconversion, according to one embodiment of the present invention.

FIG. 7 illustrates a reader 700 having a single, fixed-frequency LO for both the transmit upconversion and receive downconversion, according to one embodiment of the present invention. This embodiment is similar to the embodiment of FIG. 3 except that the waveform generator, the channel filter, the baseband SSB modulator, and the baseband demodulator are implemented in software executed by a processor (e.g., a digital signal processor). For example, SSB modulator 305 and downconverter/demodulator 314 are replaced with an upconverter and downconverter, with the modulator being performed in software.

In this embodiment, reader 700 includes a digital signal processor (DSP) 702, DACs 704 and 706, an upconverter 705, analog-to-digital converters (ADCs) 714 and 716, a downconverter 709, and a quadrature circuit 710. This embodiment of reader 700 also includes LO 306, PA 308, coupler 310 and antenna unit 312, previously described in conjunction with the embodiment of FIG. 3.

In R→T operation, DSP 702 is configured with software (or firmware or combination of software and firmware) to implement the functions of the quadrature modulator, channel filter, and Hilbert transformer described above and thereby generate SSB digital data signals having spectra 421 and 425 (FIG. 4). DACs 706 and 704 convert the digital signals to analog signals, which are then upconverted by upconverter 705. In this embodiment, an RF signal is generated by LO 306 to have frequency of $\omega_C - \omega_M$, which is then received by mixer 412 and quadrature circuit 710. Quadrature circuit 710 produces a 90-degree phase shift in the RF signal, which is then received by mixer 414. Mixers 412 and 414 then upconvert the analog signals so that the lower sidebands are centered at frequency $\omega_C$, as described above for the embodiment of FIG. 4. Coupler 416 then sums the upconverted analog signals and provides the composite signal to antenna unit 312 (FIG. 4) for broadcast.

In T→R operation, DSP 702 performs quadrature modulation, channel filtering and Hilbert transform functions on a complex digital tone signals having a frequency of $\omega_M$. The tone signals have spectra 441 and 445 as in the embodiment of FIG. 5. DACs 706 and 704 convert the digital tone signals to analog signals, which are then upconverted by upconverter 705 as previously described. Mixers 412 and 414 then upconvert the analog tone signals they receive as described above for the embodiment of FIG. 6. These upconverted signals are then received by combiner 416 and summed. Because the upper sideband of the upconverted tone signal from mixer 414 is ideally the inverse of the upper sideband of the upconverted Hilbert transformed tone signal from mixer 412, the upper sidebands cancel each other and the resulting signal is substantially a SSB tone signal having a frequency $\omega_C$. The received RF signal (tag backscatter) is converted to baseband by downconverter 709. The means for downconverting the RF signal is provided from coupler 310 at the transmitter output, which is a CW carrier appropriately centered at $\omega_C$.

Figure 8:
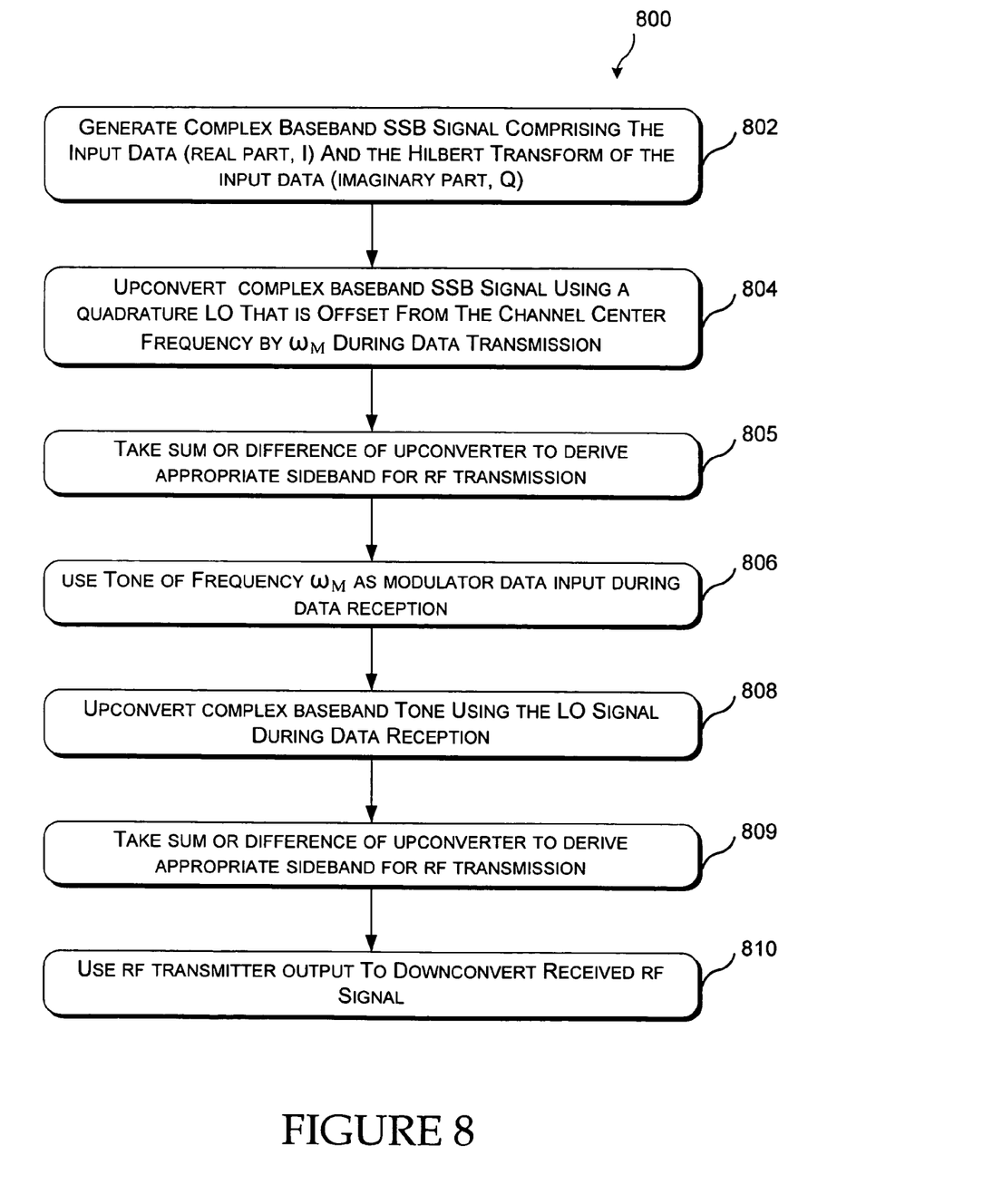
FIG. 8 is a flow diagram illustrating operational flow in generating a SSB signal and center channel carrier signal using a single RF local oscillator, according to one embodiment of the present invention.

FIG. 8 is a flow diagram illustrating operational flow 800 in generating a SSB signal and center channel carrier signal using a single RF local oscillator, according to one embodiment of the present invention. This operational flow is used to transmit a SSB data signal centered in a channel during a R→T operation and a CW carrier signal centered in the channel during T→R operation, with a single RF frequency. In accordance with this exemplary operational flow, a component (e.g., a transceiver or a RFID reader) to perform the operational flow can be advantageously implemented using a single RF LO.

Operational flow 800 may be executed by transceiver 300 of FIG. 3, reader 700 of FIG. 700, or other embodiments described above, and therefore the description of FIG. 8 may refer to at least one of the components of FIG. 3 or 7. However, any such reference to a component of FIG. 3 or 8 is for descriptive purposes only, and it is to be understood that the implementations of FIGS. 3 and 8 are a non-limiting environments for operational flow 800.

In a first operational mode, at a block 802, a complex baseband signal is generated. For example, this first operational mode can be R→T operation of an RFID system. This complex baseband signal is generated using input data (i.e., data to be transmitted). In this embodiment, the complex baseband signal's real part is represented by the in-phase (I) part of the signal, whereas the complex baseband signal's imaginary part represented by the quadrature (Q) part of the signal is the Hilbert transform of the input data signal. Thus, the complex baseband signal has I and Q component signals. In one embodiment, the complex input data is generated by a waveform generator and a SSB modulator such as waveform generator 302 and SSB modulator 305 (FIG. 3). Embodiments of the SSB modulator can include Hilbert transformers such as Hilbert transformers 402 or 602 described above in conjunction with FIGS. 4 and 6, respectively.

At a block 804, the complex baseband SSB signal is upconverted using a RF signal that is offset from the channel's center frequency (i.e., $\omega_C$) by the single sideband bandwidth $\omega_M$. In one embodiment, LO 306 (FIG. 3) provides an RF signal having frequency $\omega_C+\omega_M$) to upconvert the complex baseband signal generated in block 802. For example, a signal cos $(\omega_C+\omega_M)$ t is used to upconvert the I component signal and a signal sin $(\omega_C+\omega_M)$ t is used to upconvert the Q component signal.

At a block 805, the upconverted complex signal components are combined. In embodiments in which the RF signal used for upconversion has a frequency of $\omega_C+\omega_M$, the upconverted component signals are summed so that the upper sidebands of the component signals cancel, resulting in a lower sideband SSB signal centered on frequency $\omega_C$. This SSB signal is then transmitted during the first operational mode.

In a second operational mode, at a block 806, a SSB tone signal having a frequency $\omega_M$ is generated. For example, this second operational mode can be T→R operation of an RFID system. In one embodiment, the tone signal is generated by a waveform generator and a SSB modulator such as waveform generator 302 and SSB modulator 305 (FIG. 3). This operation results in the Q component signal having an inverted upper sideband.

At a block 808, the SSB tone signal is upconverted using the same RF signal described in block 804 (i.e., offset from the channel's center frequency by the SSB bandwidth $\omega_M$).

At a block 809, the upconverted tone signal components are combined. In embodiments in which the RF signal used for upconversion has a frequency of $\omega_C+\omega_M$, the upconverted component signals are summed so that the upper sidebands of the component signals cancel, resulting in a lower sideband SSB tone signal centered at frequency $\omega_C$. This SSB tone signal is then transmitted during the second operational mode. For example, this SSB tone can be advantageously used by RFID tags as a carrier signal during T→R operation of an RFID system.

At a block 810, the transmitted SSB tone signal is also used to downconvert a received signal having data modulated on a $\omega_C$ carrier signal. Block 810 can be performed by transceiver embodiments, including reader embodiments of an RFID system.

Reference has been made throughout this specification to "one embodiment," "an embodiment," or "an example embodiment" meaning that a particular described feature, structure, or characteristic is included in at least one embodiment of the present invention. Thus, usage of such phrases may refer to more than just one embodiment. Furthermore, the described features, structures, or characteristics may be combined in any suitable manner in one or more embodiments.

In addition, embodiments of the present invention may be implemented not only with physical components (e.g., within a semiconductor chip), but also within machine-readable media. For example, the designs described above may be stored upon and/or embedded with machine readable media associated with a design tool used for designing semiconductor devices. Examples include designs defined/formatted in VHSIC Hardware Description Language (VHDL), Verilog language and SPICE language. Some netlist examples include: a behavior level netlist, a register transfer level (RTL) netlist, a gate level netlist, and a transistor level netlist. Machine readable media also include media having layout information such as a GDS-II file. Further, netlist files or other machine-readable media for semiconductor chip design may be used in a simulation to perform the methods of the embodiments disclosed herein.

Thus, embodiments of the present invention may be used as or to support software program executed upon some form of processing core (e.g., a CPU of a computer) or otherwise implemented or realized upon or within a machine-readable medium. A machine-readable medium includes any mechanism for storing or transmitting information in a form readable by a machine (e.g. a computer). For example, a machine-readable medium can include read only memory (ROM), random access memory (RAM), magnetic disk storage media, optical storage media, flash memory devices, etc. In addition, machine-readable media can include propagated signals such as electrical, optical, acoustical or other form of propagated signal (e.g., carrier wave signals, infrared signals, digital signals, etc.)

One skilled in the relevant art may recognize, however, that the invention may be practiced without one or more of the specific details, or with other methods, resources, materials, etc. In other instances, well known structures, resources, or operations have not been shown or described in detail merely to avoid obscuring aspects of the invention.

While example embodiments and applications have been illustrated and described, it is to be understood that the invention is not limited to the precise configuration and resources described above. Various modifications, changes, and variations apparent to those skilled in the art may be made in the arrangement, operation, and details of the methods and systems of the present invention disclosed herein without departing from the scope of the claimed invention.

What is claimed is:

1. A circuit for generating a single-sideband (SSB) signal, the circuit comprising:
   a waveform generator to output a data waveform during a first phase and to output a tone waveform during a second phase, the tone waveform having a frequency that depends on maximum frequency of the data waveform, wherein the data waveform has a SSB bandwidth substantially within a wireless communication channel;
   an oscillator to output a signal having a frequency that is offset from a center frequency of the wireless communication channel by an amount that depends on the tone waveform's frequency; and
   a SSB modulator coupled to the waveform generator and the oscillator, wherein the SSB modulator is to output a signal that is dependent on the output signals of the waveform generator and oscillator.

2. The circuit of claim 1 further comprising a filter to filter the data waveform so that the filtered data waveform has a spectrum that is contained within the wireless communication channel's bandwidth.

3. The circuit of claim 1 wherein the output signal of the oscillator has a frequency that is substantially equal to the difference between the center frequency of the wireless communication channel and the frequency of the tone waveform.

4. The circuit of claim 1 wherein a signal derived from the output signal of the SSB modulator is to be provided to a RF demodulator during the second phase.

5. The circuit of claim 1 wherein the SSB modulator comprises a Hilbert transformer to derive an imaginary portion of a complex baseband signal.

6. The circuit of claim 5 wherein the waveform generator and Hilbert transformer are implemented using a processor configured to execute a program.

7. The circuit of claim 1 further comprising a circuit to receive an output signal of a local oscillator and to output in-phase and quadrature signals.

8. The circuit of claim 1 wherein the SSB modulator further comprises: an RF upconverter to output upconverted I and Q signals in response to receiving a complex baseband signal; and a circuit to combine the upconverted I and Q signals.

9. A computer-readable medium having stored thereon a design of a circuit according to claim 1.

10. A method for generating a single-sideband (SSB) signal, the method comprising:
generating a complex baseband SSB signal using a complex data signal, wherein the SSB signal has a bandwidth substantially within a wireless communication channel during a first phase;
upconverting the SSB signal using a radio frequency (RF) signal having a frequency that is offset from a center frequency of the wireless communication channel by an amount that depends on the bandwidth of the SSB signal during the first phase;
generating a tone signal during a second phase, the tone signal have a frequency that depends on the bandwidth of the SSB signal; and
upconverting the tone signal using the RF signal.

11. The method of claim 10 further comprising, filtering the data signal so that the filtered data signal has a sideband that is within the bandwidth of the wireless communication channel.

12. The method of claim 10 wherein the RF signal has a frequency that is substantially equal to a difference between the center frequency of the wireless communication channel and the frequency of the tone signal.

13. The method of claim 10 further comprising deriving a signal from the upconverted tone signal to be provided to a demodulator during the second phase.

14. The method of claim 10, wherein generating a SSB signal comprises performing a Hilbert transform to derive an imaginary (Q) portion of the data signal.

15. The method of claim 14, wherein upconverting comprises upconverting the Q portion of the data signal and a real part (I) portion of the data signal, and further comprising combining the upconverted I and Q portions.

16. The method of claim 14 wherein a processor is programmed to perform the Hilbert transform.

17. The method of claim 10 further comprising generating a signal in quadrature with the RF signal to be used in generating the SSB-modulated RF signal.

18. An apparatus to generate a single-sideband signal in a RFID transceiver, the apparatus comprising:
means for generating a SSB signal using a complex data signal, wherein the SSB signal has a bandwidth substantially within a wireless communication channel during a first phase;
means for generating a tone signal during a second phase, the tone signal having a frequency that depends on the bandwidth of the SSB signal;
means for generating a radio frequency (RF) signal having a frequency that is offset from a center frequency of the wireless communication channel by an amount that depends on the tone signal's frequency; and
means for upconverting the SSB signal during the first phase and the tone signal during the second phase, wherein the means for upconverting uses the RF signal to upconvert the SSB and tone signals.

19. The apparatus of claim 18 further comprising means for filtering the data signal so that the filtered data signal has a sideband that is within the bandwidth of the wireless communication channel.

20. The apparatus of claim 18 wherein the RF signal has a frequency that is substantially equal to the difference between the center frequency of the wireless communication channel and the frequency of the tone signal.

21. The apparatus of claim 18 further comprising means for deriving a signal from the upconverted tone signal to be provided to a demodulator during the second phase.

22. The apparatus of claim 18, wherein the means for generating a SSB signal further comprises means for performing a Hilbert transform to derive an imaginary (Q) portion of the complex data signal.

23. The apparatus of claim 22, wherein the means for generating a SSB signal further comprises means for providing upconverted I and Q signals in response to receiving a complex baseband signal; and means for combining the upconverted I and Q signals.

24. The apparatus of claim 22 wherein the means for performing a Hilbert transform comprises a processor that is programmed to perform the Hilbert transform.

25. The apparatus of claim 18 wherein the means for generating a SSB signal further comprises means for generating a signal in quadrature with the RF signal to be used in generating the SSB-modulated RF signal.

26. A computer-readable medium having stored thereon a design of an apparatus according to claim 18.

27. A reader for use in an RFID system, the reader comprising:
a waveform generator to output a data waveform during a transmit phase and to output a tone waveform during a receive phase, the tone waveform having a frequency that depends on maximum frequency of the data waveform, wherein the data waveform has a SSB bandwidth substantially within a preselected wireless communication channel;
a local signal generator to output a signal having a frequency that is offset from a center frequency of the wireless communication channel by an amount that depends on the tone waveform's frequency; and
a SSB modulator coupled to the waveform generator and the local signal generator, wherein the SSB modulator is to output a signal that is dependent on the output signals of the waveform generator and the local signal generator.

28. The reader of claim 27 wherein the output signal of the local signal generator has a frequency that is substantially equal to a difference between the center frequency of the preselected channel and the frequency of the tone waveform.

29. The reader of claim 27 wherein a signal derived from the output signal of the SSB modulator is to be provided to a RF demodulator during the receive phase.

30. The reader of claim 27 wherein the SSB modulator comprises a Hilbert transformer to derive the imaginary (Q) component of a complex baseband signal.

* * * * *

UNITED STATES PATENT AND TRADEMARK OFFICE
CERTIFICATE OF CORRECTION

PATENT NO. : 7,107,022 B1
APPLICATION NO. : 11/073340
DATED : September 12, 2006
INVENTOR(S) : Thomas et al.

It is certified that error appears in the above-identified patent and that said Letters Patent is hereby corrected as shown below:

In column 3, line 65, delete "($\omega_C+\omega_M$." and insert -- $\omega_C+\omega_M$. --, therefor.

In column 5, line 62, delete "coc." and insert -- $\omega_C$. --, therefor.

In column 6, line 3, delete "c." and insert -- $\omega_C$. --, therefor.

Signed and Sealed this

Eighth Day of April, 2008

JON W. DUDAS
*Director of the United States Patent and Trademark Office*